(12) United States Patent
Hisakuni et al.

(10) Patent No.: US 10,602,633 B2
(45) Date of Patent: Mar. 24, 2020

(54) ELECTRONIC APPARATUS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yousuke Hisakuni, Sagamihara Kanagawa (JP); Nobuhiro Yamamoto, Yokohama Kanagawa (JP); Kota Tokuda, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/119,944

(22) Filed: Aug. 31, 2018

(65) Prior Publication Data

US 2019/0304511 A1    Oct. 3, 2019

(30) Foreign Application Priority Data

Mar. 30, 2018    (JP) .................................. 2018-067161

(51) Int. Cl.
*H05K 5/06*    (2006.01)
*G11B 33/14*    (2006.01)
(Continued)

(52) U.S. Cl.
CPC ............. *H05K 5/069* (2013.01); *G11B 33/08* (2013.01); *G11B 33/1493* (2013.01);
(Continued)

(58) Field of Classification Search
CPC ................ G11B 33/1493; G11B 33/08; G11B 2220/2516; H05K 5/03; H05K 5/0247;
(Continued)

(56) References Cited

U.S. PATENT DOCUMENTS 6,388,208 B1 * 5/2002 Kiani ................... H05K 1/0222
174/260
9,196,303 B2   11/2015 Hirano et al.
(Continued)

FOREIGN PATENT DOCUMENTS

JP        H08028111 A    1/1996
JP        2015181080 A   10/2015

*Primary Examiner* — Daniel P Wicklund
*Assistant Examiner* — Sagar Shrestha
(74) *Attorney, Agent, or Firm* — Kim & Stewart LLP

(57) ABSTRACT

According to one embodiment, an electronic apparatus includes, for example, a casing having an opening with a perimeter, and a circuit board including a first surface facing away from the casing and a second surface facing the casing, a first conductor which extends over the opening in the casing and at least a portion of which is located over the first surface, a second conductor at least portion of which extends over the second surface and is exposed to the interior of the casing at the opening in the casing, and a third conductor extending through the first surface and the second surface and electrically connected to the first conductor and the second conductor at a location outward of the perimeter of the opening.

8 Claims, 11 Drawing Sheets

(51) Int. Cl.
*H05K 1/02* (2006.01)
*H05K 5/00* (2006.01)
*H05K 5/02* (2006.01)
*G11B 33/08* (2006.01)
*H05K 5/03* (2006.01)

(52) U.S. Cl.
CPC ........... *H05K 1/0218* (2013.01); *H05K 5/006* (2013.01); *H05K 5/0247* (2013.01); *H05K 5/03* (2013.01); *G11B 2220/2516* (2013.01); *H05K 5/0052* (2013.01); *H05K 2201/0723* (2013.01)

(58) Field of Classification Search
CPC ...... H05K 5/006; H05K 1/0218; H05K 5/069; H05K 5/0052; H05K 2201/0723; H05K 3/4644; H05K 3/429; H05K 1/0298; H05K 2201/09454
See application file for complete search history.

(56) References Cited

U.S. PATENT DOCUMENTS

| | | | |
|---|---|---|---|
| 9,736,940 B2 | 8/2017 | Albrecht et al. | |
| 9,747,953 B1 | 8/2017 | Shimomura et al. | |
| 2005/0146390 A1* | 7/2005 | Baek | H01P 5/02 333/33 |
| 2006/0234528 A1* | 10/2006 | Nakano | H05K 3/3405 439/76.2 |
| 2008/0024908 A1* | 1/2008 | Nakamiya | G11B 25/043 360/97.22 |
| 2008/0165449 A1* | 7/2008 | Shindo | G11B 25/043 360/97.22 |
| 2008/0285243 A1* | 11/2008 | Kagawa | G11B 25/043 361/749 |
| 2014/0112015 A1* | 4/2014 | Kurebayashi | H05K 1/0204 362/547 |
| 2017/0278551 A1 | 9/2017 | Onobu et al. | |
| 2017/0294737 A1* | 10/2017 | Horchler | H01R 12/716 |
| 2018/0263108 A1* | 9/2018 | Tsukuda | H05K 1/181 |
| 2019/0150305 A1* | 5/2019 | Naohara | H05K 5/0204 |

\* cited by examiner

ELECTRONIC APPARATUS

CROSS-REFERENCE TO RELATED APPLICATION

This application is based upon and claims the benefit of priority from Japanese Patent Application No. 2018-067161, filed Mar. 30, 2018, the entire contents of which are incorporated herein by reference.

FIELD

Embodiments described herein relate generally to an electronic apparatus.

BACKGROUND

In a known electronic apparatus, electronic components are accommodated in a casing.

DETAILED DESCRIPTION

An embodiment provides an electronic apparatus having a novel, less disadvantageous configuration in a portion, for example, where a conductor penetrates a casing.

In general, according to one embodiment, an electronic apparatus includes, for example, a casing having an opening with a perimeter, and a circuit board including a first surface facing away from the casing and a second surface facing the casing, a first conductor which extends over the opening in the casing and at least a portion of which is located over the first surface, a second conductor at least portion of which extends over the second surface and is exposed to the interior of the casing at the opening in the casing, and a third conductor extending through the first surface and the second surface and electrically connected to the first conductor and the second conductor at a location outward of the perimeter of the opening.

Exemplary embodiments and modifications of an electronic apparatus will be disclosed hereinafter. Configurations (technical features) of the embodiments described below are given as an example. It is noted that configurations of a plurality of embodiments described below include similar constituent elements and each embodiment can attain similar effects based on the similar constituent elements. In the following description, the similar constituent elements are each denoted by a common reference sign and repetitive description thereof will be sometimes omitted. Furthermore, each drawing is schematic and dimensions and the like in each drawing may differ from those of actual configurations.

Moreover, for the sake of convenience, arrows indicating directions are shown in each drawing. An arrow X indicates a longitudinal direction of a casing 10, an arrow Y indicates a short-length direction of the casing 10, and an arrow Z indicates a thickness direction of the casing 10. The longitudinal direction of the casing 10, the short-length direction of the casing 10, and the thickness direction of the casing 10 are orthogonal to one another.

[First Embodiment]

Figure 1:
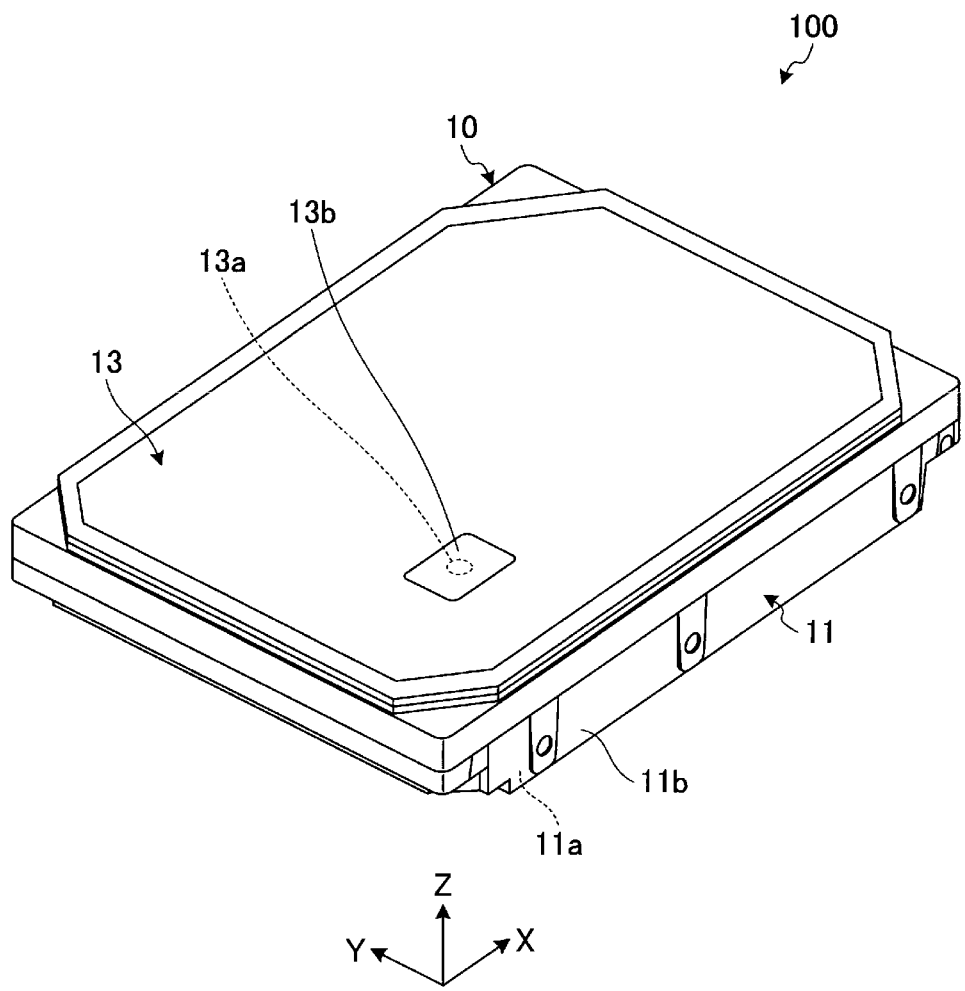
FIG. 1 is an exemplary, schematic perspective view of an electronic apparatus according to embodiments.
Figure 2:
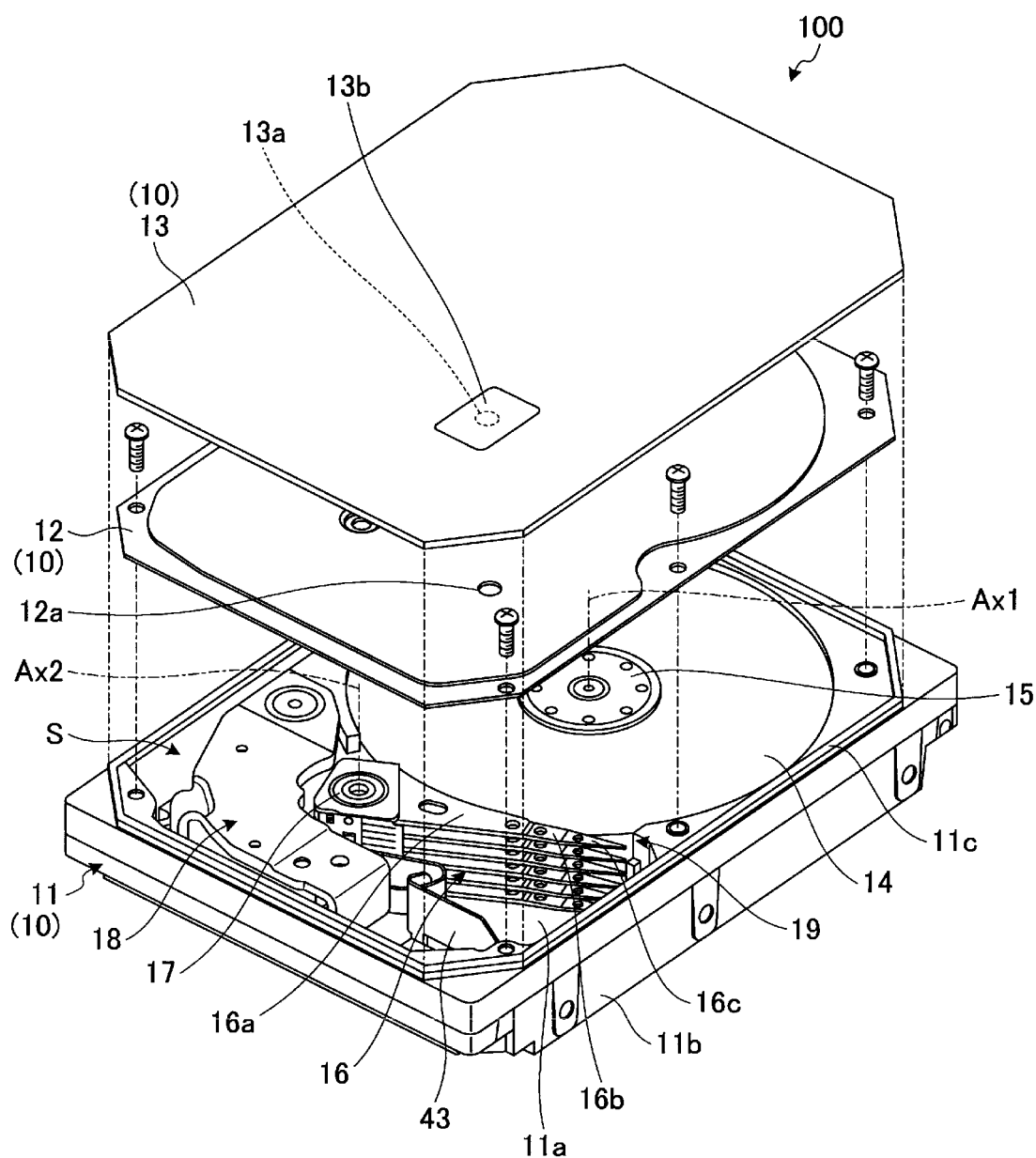
FIG. 2 is an exemplary, schematic exploded perspective view of the electronic apparatus according to the embodiments.

FIG. 1 is a perspective view illustrating an appearance of a hard disk drive 100 (HDD) according to present embodiments, and FIG. 2 is an exploded perspective view of the HDD 100. As shown in FIG. 1, the HDD 100 includes a flat, rectangular parallelepiped casing 10. Furthermore, as shown in FIG. 2, the casing 10 has a base 11, an inner cover 12, and an outer cover 13. The HDD 100 is an example of the electronic apparatus.

The base 11 is a bottomed container and has a bottom wall 11a and a peripheral wall 11b. A shape of the bottom wall 11a is a quadrangular, plate shape. A shape of the peripheral wall 11b is a plate shape and the peripheral wall 11b protrudes from a periphery of the bottom wall 11a at a generally constant height. The bottom wall 11a and the peripheral wall 11b are configured integrally out of a metallic material such as an aluminum alloy.

As shown in FIG. 2, an internal space S of the base 11 is covered with the inner cover 12 and the outer cover 13. The inner cover 12 is fixed to an upper surface of the peripheral wall 11b by, for example, connection tools such as screws. Furthermore, the outer cover 13 is fixed to the tip end 11c of the peripheral wall 11b by, for example, welding in a state of covering the inner cover 12. The outer cover 13 and the peripheral wall 11b are bonded together to prevent gas leakage. In the present embodiment, the bottom wall 11a, the peripheral wall 11b, and the outer cover 13 are an example of a wall.

Vent holes 12a and 13a are provided in the inner cover 12 and the outer cover 13, respectively. After components are attached within the base 11, the inner cover 12 and the outer cover 13 are attached to the base 11, and the casing 10 is assembled, then air within the casing 10 is evacuated from the vent holes 12a and 13a and gas different than air is filled instead into the casing 10. Examples of the gas filled into the casing 10 include low density gas lower in density than the air and inert gas of low reactivity, and a specific example of the gas is helium; however, the gas is not limited to helium. The vent hole 13a of the outer cover 13 is closed by a seal 13b, which prevents leakage of the filled gas from the vent hole 13a. In this way, in a state of assembling the HDD 100, the casing 10 is airtightly, hermetically sealed and the gas different from the air is sealed in the casing 10. It is noted that an interior of the casing 10 may be kept in a vacuum state of a state close to the vacuum state or may be kept at a pressure lower than an atmospheric pressure. The gas sealed into the casing 10 will be referred to as "sealing gas".

As shown in FIG. 2, a magnetic disk 14 and a spindle motor 15 are accommodated in the casing 10. The spindle motor 15 is supported by the bottom wall 11a and drives the magnetic disk 14 to rotate at a predetermined rotation speed about a rotation center Ax1 crossing (orthogonal to) the bottom wall 11a. The magnetic disk 14 is attached to a hub, not shown, of the spindle motor 15 concentrically with each other. The number of magnetic disks 14 may be one or two or more. In a case of providing a plurality of magnetic disks 14 as in the example of FIG. 2, the plurality of magnetic disks 14 are parallel to one another and parallel to the bottom wall 11a.

A head assembly 16 provided within the casing 10 is supported by the bottom wall 11a via a bearing 17 located radially outward of the magnetic disks 14 in such a manner as to be rotatable about a rotation center Ax2 parallel to the rotation center Ax1. The head assembly 16 has arms 16a extending along the bottom wall 11a. The number of arms 16a is equal to the number of magnetic disks 14. A magnetic head 16c is attached to a tip end of each arm 16a via a suspension 16b. The magnetic heads 16c and the magnetic disks 14 are examples of electrical components.

Moreover, a voice coil motor 18 (VCM) and a ramp load mechanism 19 are provided within the casing 10. The VCM 18 controls rotation and positioning of the head assembly 16. The ramp load mechanism 19 keeps the magnetic heads 16c each at an unload position spaced apart from the magnetic disk 14. The VCM 18 is an example of the electrical components.

Figure 3:
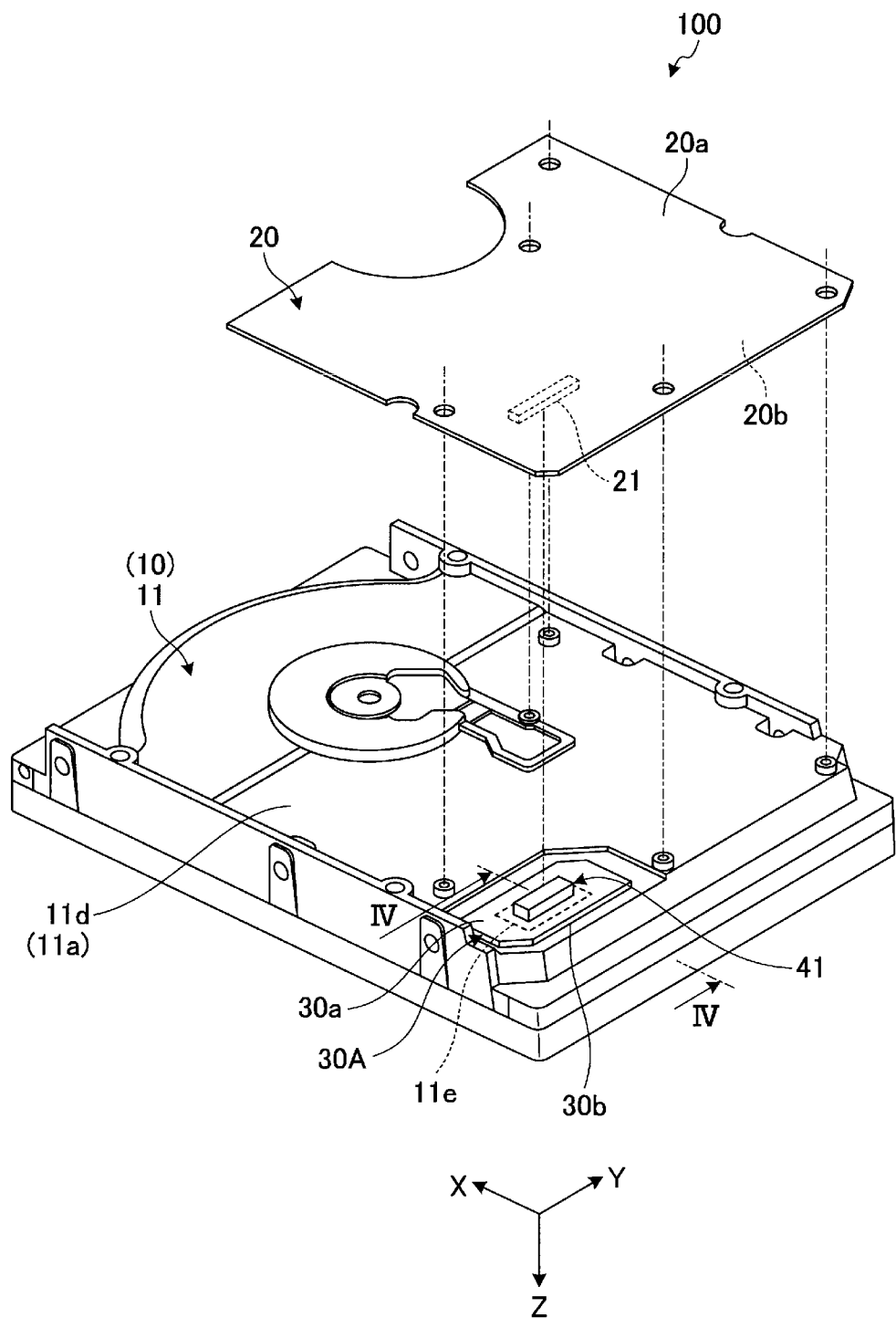
FIG. 3 is an exemplary, schematic exploded perspective view of the electronic apparatus according to the embodiments, with the electronic apparatus viewed from an opposite side thereof to that in FIG. 2.

FIG. 3 is an exploded perspective view of the HDD 100, with the HDD 100 viewed from the side opposite to FIG. 2. As shown in FIG. 3, a printed circuit board 20 (PCB) is attached onto an outer surface 11d of the bottom wall 11a of the base 11 in parallel to the bottom wall 11a with a gap kept between the PCB 20 and the bottom wall 11a. The PCB 20 is, for example, a rigid board such as a glass epoxy board, a multilayer board, or a built-up board; however, the PCB 20 is not limited to these boards. The PCB 20 could be also referred to as "circuit board". The PCB 20 has a first surface 20a and a second surface 20b. The PCB 20 is fixed to the base 11 by snap-fit mechanisms such as connection tools, for example, screws or rivets, or elastic hooks in a posture in which the second surface 20b faces the outer surface 11d and the first surface 20a is exposed. Electrical components (not shown) such as an IC, a coil, a capacitor, and a resistor are mounted on the PCB 20, and these electrical components and interconnections provided on the PCB 20 configure a control board that exercises control over an operation and a computing process of the HDD 100.

A control signal, data, and the like are transmitted between the PCB 20 and each magnetic head 16c and between the PCB 20 and the VCM 18 via a connector 21, a connector 41, a PCB 30A, a connector 42 (refer to FIG. 4), and an interconnection member 43 (refer to FIG. 2). The interconnection member 43 is, for example, a flexible printed circuit (FPC). The PCB 30A is an example of a circuit board.

The PCB 30A is, for example, a rigid board such as a glass epoxy board, a multilayer board, or a built-up board; however, the PCB 30A is not limited to these boards.

The PCB 30A is attached to the bottom wall 11a in a state of covering an opening 11e provided in the bottom wall 11a. The opening 11e is a through-hole opening in a direction generally orthogonal to the bottom wall 11a. An opening direction of the opening 11e is a thickness direction of the casing 10, a thickness direction of the bottom wall 11a, and a direction generally orthogonal to the outer surface 11d. The opening direction of the opening 11e (Z direction or an opposite direction to the Z direction) will be referred to as "first direction" hereinafter. When viewed from the first direction, a shape (sectional shape) of the opening 11e is a rectangular shape that is short in the longitudinal direction of the casing 10 and long in the short-length direction of the casing 10; however, the shape of the opening 11e is not limited to this shape.

The connector 41 extends along the opening 11e and along the short-length direction of the casing 10. Although not shown in FIG. 3, a shape of the connector 42 is similar to that of the connector 41. Specifications of the connector 41 may be identical to those of the connector 42.

In a case of sealing the gas into the casing 10 or keeping the interior of the casing 10 in a state of a lower pressure than the atmospheric pressure, the PCB 30A is fixed to the bottom wall 11a by a scheme and a structure for ensuring airtightness to prevent the gas within the casing 10 from leaking to an outside of the casing 10 via a region where the PCB 30A covers the opening 11e or the gas outside of the casing 10 from entering the casing 10. For ensuring the airtightness, a seal member of an elastomer or the like, a highly airtight sealant, or the like may be interposed between the PCB 30A and the bottom wall 11a. The PCB 30A could be also referred to as "relay board", "connection board", "sealing board", and the like.

The PCB 30A has an outer surface 30a and an inner surface 30b. The outer surface 30a is exposed to the outside of the casing 10 and faces the second surface 20b of the PCB 20. The inner surface 30b is provided opposite to the outer surface 30a. Part of the inner surface 30b is exposed to the inside of the casing 10 via the opening 11e. The airtightness is ensured between a portion, which is peripheral for the opening 11e, of the inner surface 30b and the outer surface 11d of the bottom wall 11a. The first direction is a direction generally orthogonal to the PCB 30A, a direction generally orthogonal to the outer surface 30a and the inner surface 30b, and a thickness direction of the PCB 30A. The outer surface 30a is an example of a first surface, and the inner surface 30b is an example of a second surface.

It is noted that the PCB 30A may be fixed to an inner surface of the bottom wall 11a inside of the casing 10 and may cover the opening 11e from an inside of the casing 10. In this case, part of the outer surface 30a is exposed to the outside of the casing 10 via the opening 11e and the inner surface 30b is exposed to the inside of the casing 10.

The connector 41 is mounted on the outer surface 30a of the PCB 30A. In addition, the connector 21 is mounted on the second surface 20b of the PCB 20. The PCB 20 is attached to the casing 10 in a state in which the connectors 41 and 21 are mechanically and electrically connected to each other. Furthermore, the connector 42 (refer to FIG. 4) is mounted on the inner surface 30b of the PCB 30A. A connector (not shown) attached to the interconnection member 43 is installed to the connector 42.

At least part of the connector 42 is accommodated in the opening 11e with a gap kept between the connector 42 and the opening 11e. It is noted that with the configuration such that the PCB 30A is fixed to the inner surface of the bottom wall 11a inside of the casing 10 and the PCB 30A covers the opening 11e from the inside of the casing 10, at least part of the connector 41 is accommodated in the opening 11e with a gap kept between the connector 41 and the sides of the opening 11e.

Figure 4:
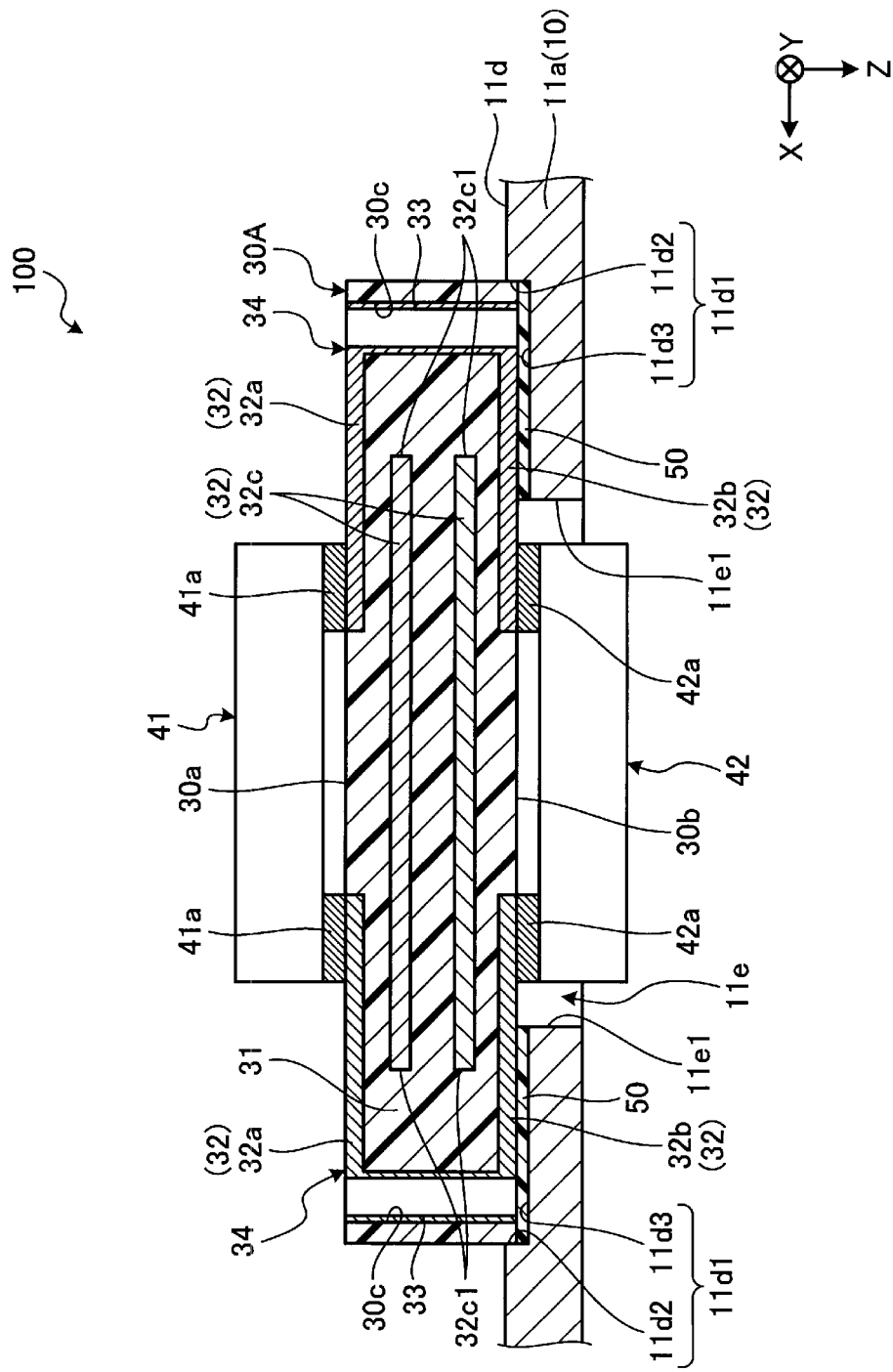
FIG. 4 is an exemplary, schematic cross-sectional view schematically of an electronic apparatus according to a first embodiment, taken along positions IV-IV of FIG. 3.
Figure 5:
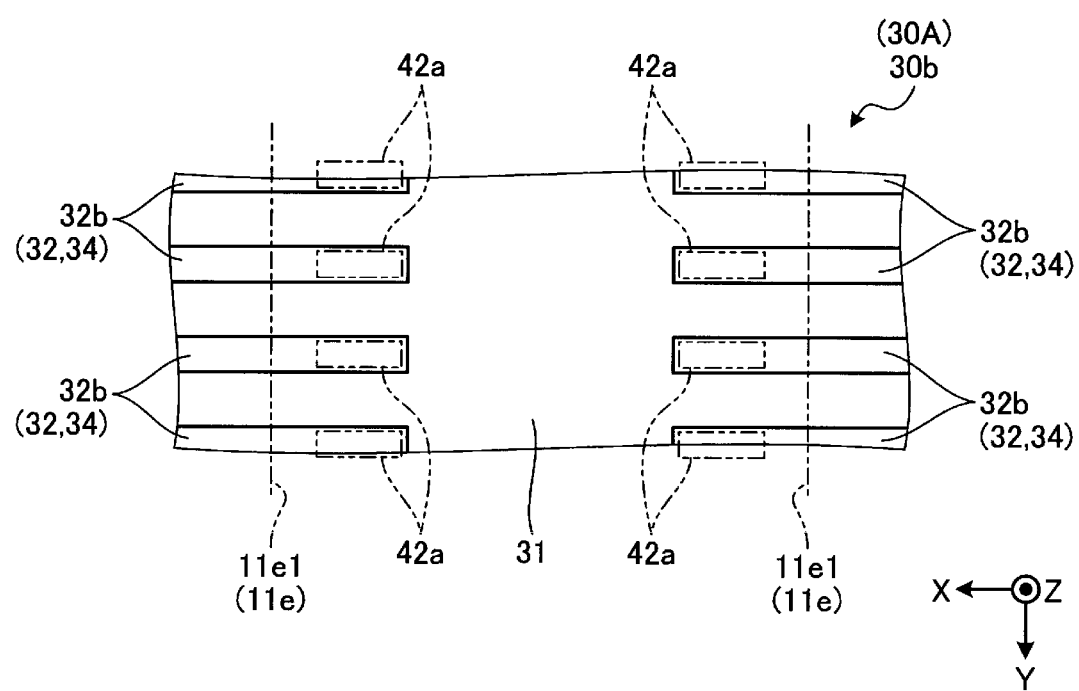
FIG. 5 is an exemplary, schematic plan view of part of a circuit board according to the first embodiment.

FIG. 4 is a cross-sectional view of the PCB 30A taken along IV-IV positions of FIG. 3. FIG. 5 is a plan view of part of the inner surface 30b of the PCB 30A.

As shown in FIG. 4, the PCB 30A has a flattened base material layer 31 and conductor layers 32. In addition, a cylindrical through-hole 30c penetrating between the outer surface 30a and the inner surface 30b in the first direction is provided in the PCB 30A, and a cylindrical conductor layer 33 is provided on an inner surface (inner circumferential surface) of the through-hole 30c by, for example, plating or the like. The conductor layer 33 penetrates the PCB 30A in the first direction. The conductor layer 33 has a hollow interior.

The PCB 30A includes a stack of the base material layer 31 and the conductor layers 32. The base material layer 31 may be made of an insulating material such as epoxy glass resin. The conductor layers 32 and 33 may be made of a conductive metallic material such as a copper-based material.

The conductor layers 32 include conductor layers 32a, 32b, and 32c. The conductor layer 32a is provided on the outer surface 30a. The conductor layer 32b is provided on the inner surface 30b. The conductor layers 32c are provided between the outer surface 30a and the inner surface 30b. The conductor layers 32a, 32b, and 32c each extend in a direction generally orthogonal to the first direction, that is, a direction generally parallel to the outer surface 30a and the inner surface 30b. When viewed in the first direction, the conductor layers 32a, 32b, and 32c cover at least part of the opening 11e. The conductor layer 32a is an example of a first conductor and the conductor layer 32b is an example of a second conductor.

Gas permeability (rate of gas permeability) of the sealing gas into the conductor layers 32 and 33 is lower than gas permeability (rate of gas permeability) of the sealing gas into the base material layer 31. In other words, it is difficult for the sealing gas to permeate the conductor layers 32 and 33. The conductor layers 32 and 33 could be, therefore, also referred to as "shielding layers". The conductor layer 32c is an example of a first shielding layer.

At least part of the conductor layer 32a is exposed to the outside of the casing 10. The conductor layer 32a is electrically and mechanically connected to terminals (not shown) of the connector 41 via a solder 41a. In other words, at least a region, which is bonded to the solder 41a, of each conductor layer 32a is exposed. It is noted that the outer surface 30a may be covered with an insulating coat (not shown) such as a resist except for the exposed regions of the conductor layer 32a to be bonded to the solder 41a.

Furthermore, as shown in FIG. 5, at least part of the conductor layers 32b are exposed to the inside of the casing 10 via the opening 11e. The conductor layers 32b are electrically and mechanically connected to terminals (not shown) of the connector 42 via a solder 42a. In other words, at least a region, which is bonded to the solder 42a, of each conductor layer 32b is exposed. It is noted that the inner surface 30b may be covered with an insulating coat (not shown) such as a resist except for the exposed regions of the conductor layer 32b to be bonded to the solder 42a.

The outer surface 30a of the PCB 30A is configured with the base material layer 31 and the conductor layers 32a. The inner surface 30b of the PCB 30A is configured with the base material layer 31 and the conductor layers 32b. It is noted that in a case of covering the base material layer 31 or the conductor layers 32a and 32b with the coats (not shown) such as the resist, part of the outer surface 30a and the inner surface 30b are configured with the coats.

In the present embodiment, the conductor layers 32a, 33, and 32b electrically connected to one another configure conductor lines 34 electrically connecting the terminals of the connector 41 to the terminals of the connector 42. A plurality of (for example, 30) conductor lines 34 corresponding to the terminals of the connectors 41 and 42 are provided on the PCB 30A. The conductor lines 34 are signal lines, power supply lines, or ground lines. The plurality of conductor lines 34 are insulated from one another via the base material layer 31. The conductor lines 34 penetrate the bottom wall 11a (casing 10). The conductor layer 33 is an example of a third conductor.

As shown in FIG. 5, each conductor layer 32b extends along the longitudinal direction (indicated by the arrow X) of the casing 10. Although not shown in FIG. 5, each conductor layer 32a extends along the longitudinal direction of the casing 10 similarly to the conductor layers 32b. In addition, as shown in FIG. 5, the plurality of conductor layers 32b are aligned at certain intervals in the short-length direction (indicated by the arrow Y) of the casing 10. Although not shown in FIG. 5, the plurality of conductor layers 32a are aligned at certain intervals in the short-length direction of the casing 10 similarly to the conductor layers 32b. The plurality of conductor lines 34 are aligned at certain intervals in the short-length direction of the casing along both ends (both edges) of the opening 11e in the longitudinal direction of the casing 10. In other words, the plurality of conductor lines 34 are aligned in two rows.

The conductor layers 32c shown in FIG. 4 have a quadrangular shape such as a rectangular shape when viewed in the first direction (indicated by the arrow Z). Furthermore, the conductor layers 32c each have a holeless shape without an opening such as a through-hole or a notch overlapping the opening 11e. Moreover, when viewed in the first direction, an outer edge 32c1 of each conductor layer 32c is located outward of an inner edge 11e1 of the opening 11e in whole. In other words, the outer edge 32c1 surrounds the inner edge 11e1 when viewed in the first direction. The inner edge 11e1 could be also referred to as "inner circumferential surface" or "side surface". It is noted that the conductor layers 32c may be electrically connected to the ground lines or the power supply lines.

A recess portion 11d1 is provided on the outer surface 11d of the bottom wall 11a. A side surface 11d2 (outer edge) of the recess portion 11d1 has a quadrangular shape such as a rectangular shape when viewed in the first direction. The side surface 11d2 functions to position the PCB 30A in a direction along the bottom wall 11a. Another positioning element such as a protrusion may be provided as an alternative to the recess portion 11d1 or the positioning element is not necessarily provided.

The inner surface 30b of the PCB 30A is bonded to a bottom surface 11d3 of the recess portion 11d1 by an adhesive 50. The adhesive 50 exhibits, for example, insulation properties. In addition, gas permeability (gas penetration efficiency, rate of gas permeability) of the sealing gas into the adhesive 50 is lower than the gas permeability (gas penetration efficiency, rate of gas permeability) of the sealing gas into the base material layer 31. In other words, it is difficult for the sealing gas to permeate the adhesive 50. The bottom surface 11d3 is an example of a peripheral portion of the opening 11e. The adhesive 50 could be also referred to as "adhesive layer".

Furthermore, the through-hole 30c does not overlap the opening 11e and is located outwardly of the inner edge 11e1 of the opening 11e when viewed in the first direction. The through-hole 30c overlaps the adhesive 50 in the first direction. Therefore, the conductor layer 33 adjoins the adhesive 50 and overlaps the adhesive 50 when viewed in the first direction.

As described so far, in the present embodiment, the cylindrical conductor layer 33 penetrating the PCB 30A is located outward of the inner edge 11e1 of the opening 11e when viewed in the first direction, that is, in the direction generally orthogonal to the bottom wall 11a (wall). Provided that the through-hole 30c is provided at a position at which the through-hole 30c overlaps the opening 11e when viewed in the first direction, it is difficult to adopt a configuration such that the cylindrical, that is, hollow conductor layer 33 is provided on an inner surface of the through-hole 30c. This is because a gas passage connecting the inside and the outside of the casing 10 is configured within a cylindrical interior of the conductor layer 33. In that case, therefore, at least part of the conductor layer connecting, for example, the conductor layers 32a to the conductor layers 32b is configured as a solid via. Nevertheless, it takes time and labor to form the via compared with forming the cylindrical conductor layer 33 and a cost tends to be high. In this respect, according to the present embodiment, the through-hole 30c does not overlap the opening 11e, that is, is not exposed to the inside of the casing 10; thus, even if the cylindrical conductor layer 33 is provided on the inner surface of the through-hole 30c, the cylindrical interior of the conductor layer 33 does not act as the gas passage connecting the inside and the outside of the casing 10. According to the present embodiment, therefore, at a time of obtaining the HDD 100 that is less gas-permeable, for example, it is easy to reduce time and labor and cost to manufacture the conductor layer 33 that electrically connects the conductor layers 32a to the conductor layers 32b and eventually manufacture the PCB 30A.

Furthermore, in the present embodiment, the PCB 30A has the conductor layers 32c (shielding layers) located between the outer surface 30a and the inner surface 30b, and lower than the base material layer 31 in the gas permeability with respect to the sealing gas. Such a configuration enables, for example, the conductor layers 32c to prevent gas permeation through the PCB 30A. Furthermore, in the present embodiment, the conductor layer 33 is located outward of the inner edge 11e1 of the opening 11e when viewed in the first direction; thus, it is possible to configure the conductor layers 32c insulated from a plurality of conductor layers 33 relatively widely. Therefore, according to the present embodiment, it is easy to further enhance the effect of prevention of permeation by, for example, the conductor layers 32c.

Moreover, in the present embodiment, the outer edge 32c1 of each conductor layer 32c is located outward of the inner edge 11e1 of the opening 11e when viewed in the first direction. Therefore, according to the present embodiment, it is easy to further enhance the effect of prevention of permeation by, for example, the presence of the conductor layers 32c.

Furthermore, in the present embodiment, the inner surface 30b of the PCB 30A (circuit board) is bonded to the bottom surface 11d3 (peripheral portion) of the recess portion 11d1 by the adhesive 50. Therefore, according to the present embodiment, it is possible, for example, to attach the PCB 30A to the bottom wall 11a in such a manner as to cover the opening 11e relatively easily.

Moreover, in the present embodiment, the conductor layer 33 (third conductor) adjoins the adhesive 50 when viewed in the first direction. Therefore, according to the present embodiment, an end portion of the cylindrical conductor layer 33, for example, is closed by the adhesive 50; thus, it is possible to prevent the cylindrical interior of the conductor layer 33 from acting as a gas passage connecting the inside and the outside of the casing 10.

Further, in the present embodiment, the adhesive 50 exhibits insulation properties. Therefore, according to the present embodiment, it is possible to insulate, for example, the plurality of conductor lines 34 (the plurality of terminals of the connectors 41 and 42) from one another more easily. It is noted that the adhesive 50 may not exhibit insulation properties in a case in which it is ensured that the plurality of conductor line 34 are insulated from one another by other means, for example, by providing an insulating layer (insulating coat) such as a resist on the surfaces of the PCB 30A or a coating film on the surface of the bottom wall 11a.

[First Modification of First Embodiment]

Figure 6:
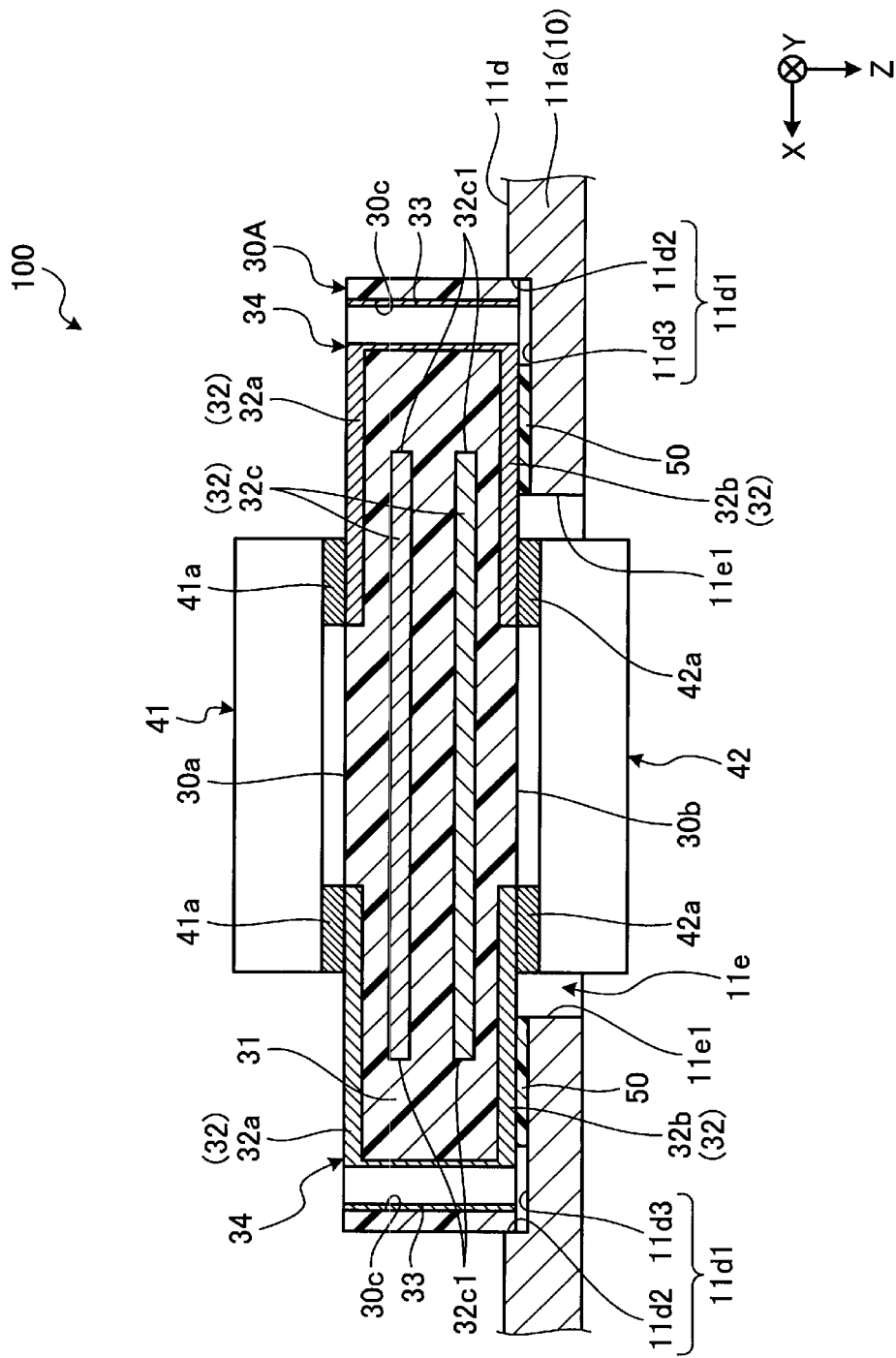
FIG. 6 is an exemplary, schematic cross-sectional view of an electronic apparatus according to a first modification of the first embodiment.

FIG. 6 is a cross-sectional view of part of the HDD 100 according to a first modification. The present modification differs from the above embodiment in that the through-hole 30c and the conductor layer 33 are located spaced from the inner edge 11e1 of the opening 11e with the adhesive 50 located only therebetween. With such a configuration, the adhesive 50 can prevent permeation of the gas between the inner surface 30b of the PCB 30A and the bottom surface 11d3 of the recess portion 11d1; thus, the cylindrical interior of the conductor layer 33 does not act as the gas passage connecting the inside and the outside of the casing 10. Therefore, the first modification can attain similar effects to those of the first embodiment.

[Second Modification of First Embodiment]

Figure 7:
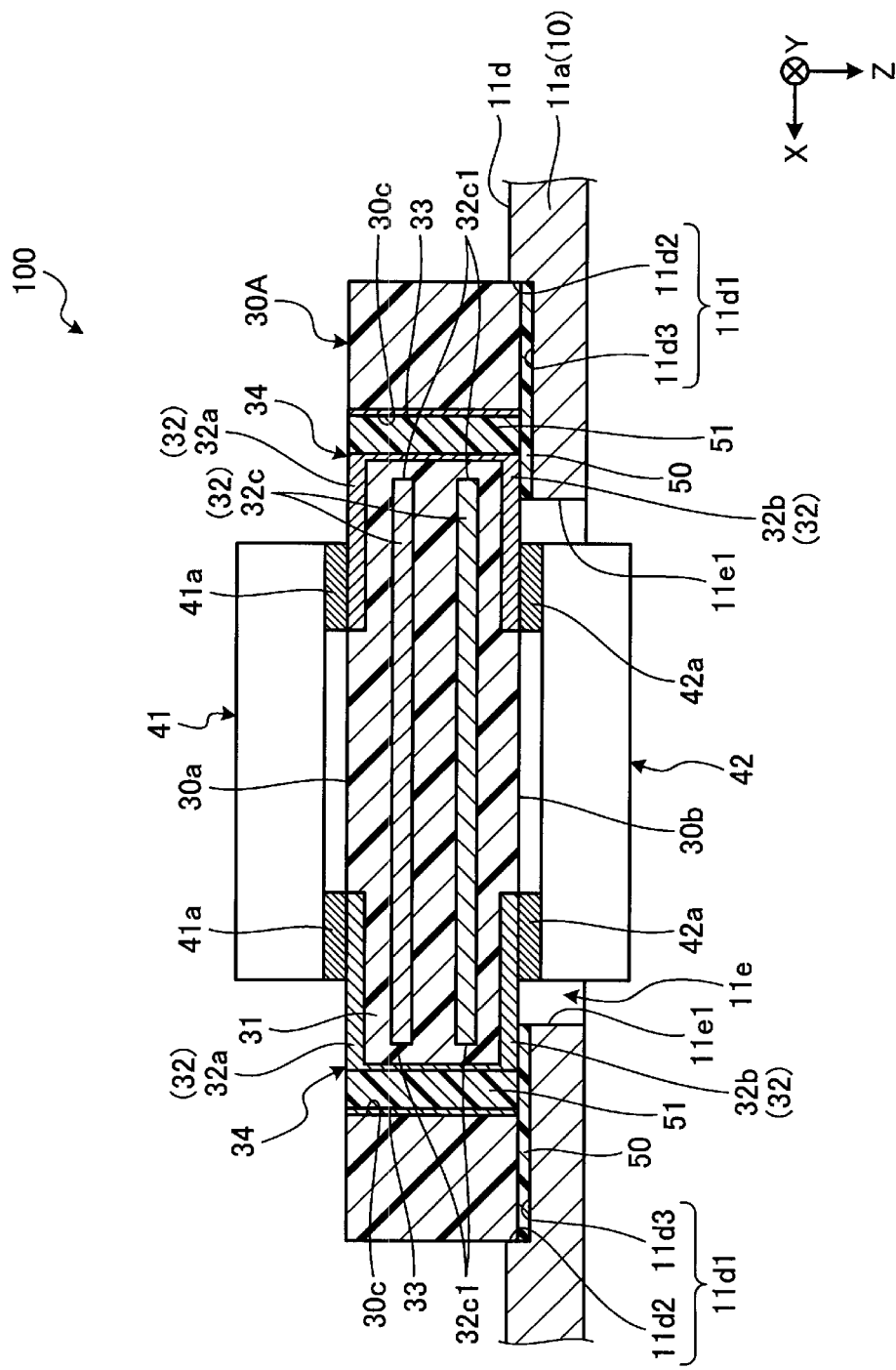
FIG. 7 is an exemplary, schematic cross-sectional view of an electronic apparatus according to a second modification of the first embodiment.

FIG. 7 is a cross-sectional view of part of the HDD 100 according to a second modification. The present modification differs from the above embodiment or the modification in that the cylindrical interior of the conductor layer 33 is filled with a shielding material 51 that prevents gas permeation therethrough. The shielding material 51 is configured with, for example, a material lower in gas permeability than the base material layer 31. The shielding material 51 is, for example, a synthetic resin material but is not limited to the synthetic resin material. With such a configuration, the shielding material 51 can prevent gas permeation in the cylindrical interior of the conductor layer 33; thus, the through-hole 30c (conductor layer 33) can be disposed closer to the opening 11e. It is thereby possible to reduce lengths of the conductor layers 32a (first conductors) and the conductor layers 32b (second conductors) and eventually lengths of the conductor lines 34, and reduce electrical resistances of the conductor lines 34. The adhesive 50 provided between the inner edge 11e1 of the opening 11e and the side surface 11d2 of the recess portion 11d1 prevents gas permeation between the inner surface 30b of the PCB 30A and the bottom surface 11d3 of the recess portion 11d1. The adhesive 50 is also present in a region opposite to the opening 11e with respect to the through-hole 30c. The shielding material 51 may be filled entirely in the cylindrical interior of the conductor layer 33 or may be filled in at least a region (zone) adjacent to the bottom wall 11a in the cylindrical interior thereof only if a condition for gas permeation is satisfied. Furthermore, the shielding material 51 may be the adhesive 50.

[Third Modification of First Embodiment]

Figure 8:
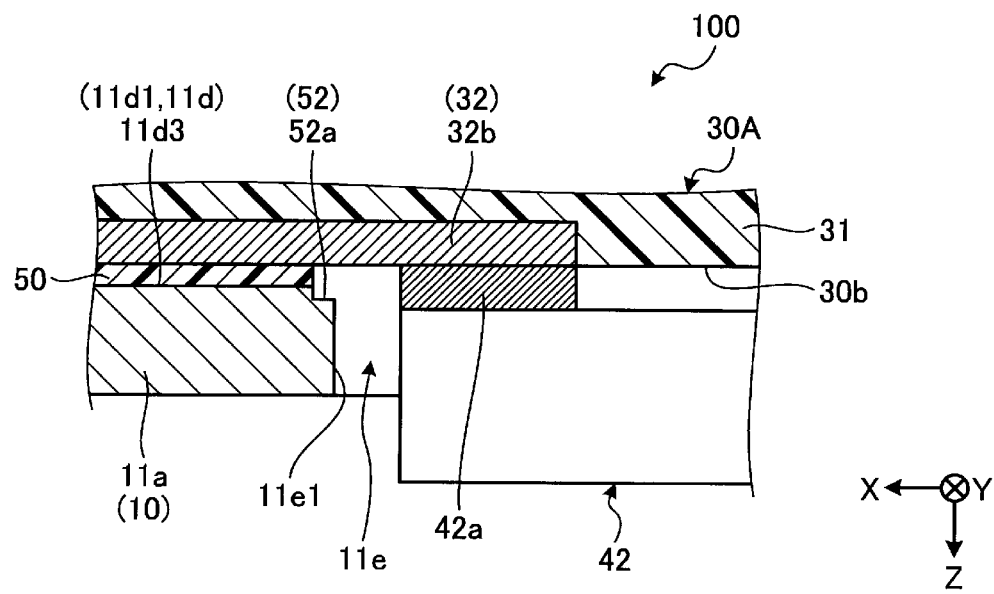
FIG. 8 is an exemplary, schematic cross-sectional view of an electronic apparatus according to a third modification of the first embodiment.

FIG. 8 is a cross-sectional view of part of the HDD 100 according to a third modification. The present modification differs from the above embodiment and the modifications in that a trap 52 for the adhesive 50 is provided in the inner edge 11e1 (inner circumferential surface) of the opening 11e. The trap 52 is configured as a step that projects from the inner edge 11e1 inwardly of the opening 11e at a position spaced from the bottom surface 11d3 (outer surface 11d of the bottom wall 11a). The trap 52 extends annularly over a circumference of the opening 11e. The trap 52 has an annular flange surface 52a that faces the inner surface 30b of the PCB 30A and turns upward in FIG. 8. The flange surface 52a could be also referred to as "stepped surface". With such a configuration, the adhesive 50 flowing from a gap between the bottom wall 11a and the PCB 30A can be captured by the trap 52; thus, it is possible to prevent the adhesive 50 from entering the casing 10 and influencing other components and the like within the casing 10. It is noted that the trap 52 may be an inward flange.

[Fourth Modification of First Embodiment]

Figure 9:
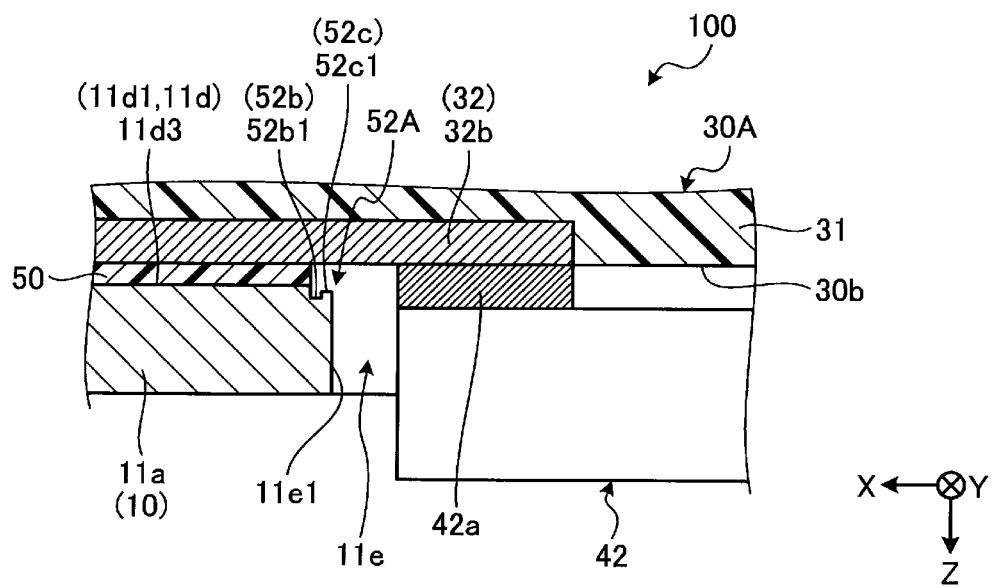
FIG. 9 is an exemplary, schematic cross-sectional view of an electronic apparatus according to a fourth modification of the first embodiment.

FIG. 9 is a cross-sectional view of part of the HDD 100 according to a fourth modification. In the present modification, similarly to the preceding modification, a trap 52A for the adhesive 50 is provided in the inner edge 11e1 (inner circumferential surface) of the opening 11e over the circumference of the opening 11e. Furthermore, the trap 52A has flange surfaces 52b1 and 52c1 facing the inner surface 30b of the PCB 30A and turning upward in FIG. 9 similarly to the trap 52. However, the present modification differs from the embodiment and the modifications in that the trap 52A is provided with a concave groove 52b or a convex wall 52c extending annularly over the circumference of the opening 11e. The concave groove 52b is open toward the inner surface 30b of the PCB 30A (upward in FIG. 9) on the flange surface 52c1. In other words, the concave groove 52b is recessed from the flange surface 52c1 in a direction apart from the inner surface 30b of the PCB 30A (downward in FIG. 9). In addition, the convex wall 52c protrudes from the flange surface 52b1 in a direction of approaching the inner surface 30b of the PCB 30A (upward in FIG. 9). The flange surface 52b1 could be also referred to as "bottom surface or stepped surface" of the concave groove 52b. The flange surface 52c1 could be also referred to as "top surface" of the convex wall 52c. With such a configuration, the adhesive 50 flowing from the gap between the bottom wall 11a and the PCB 30A can be captured by the trap 52A; thus, it is possible to prevent the adhesive 50 from entering the casing 10 and influencing the other components and the like within the casing 10.

[Fifth Modification of First Embodiment]

Figure 10:
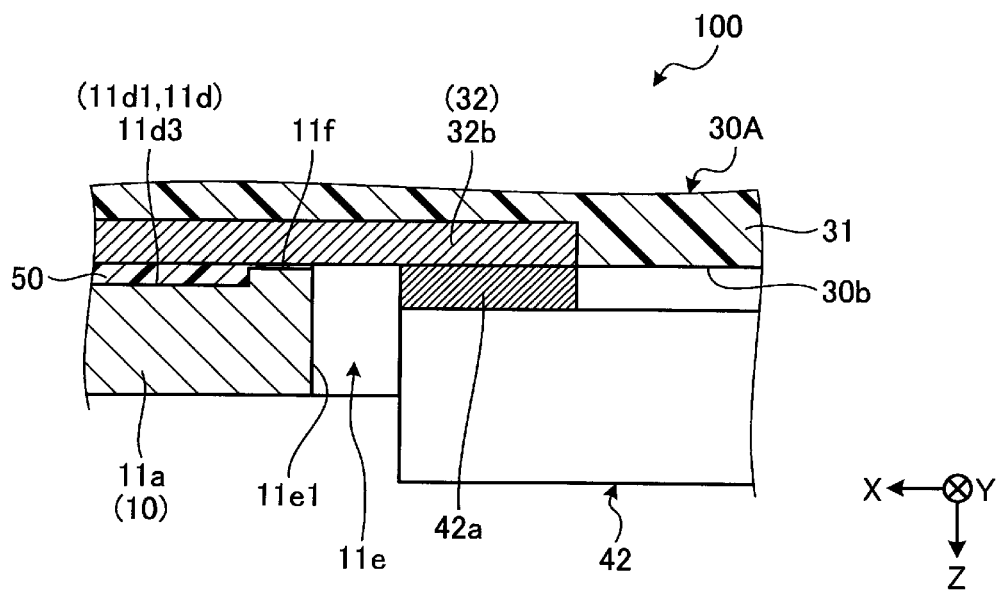
FIG. 10 is an exemplary, schematic cross-sectional view of an electronic apparatus according to a fifth modification of the first embodiment.

FIG. 10 is a cross-sectional view of part of the HDD 100 according to a fifth modification. The present modification differs from the above embodiment and the modifications in that the bottom wall 11a includes, in the gap in which the adhesive 50 is present between the PCB 30A and the bottom wall 11a, a projection 11f that partially narrows the gap (reduces a height thereof). The projection 11f protrudes from the bottom surface 11d3 (outer surface 11d of the bottom wall 11a) to be closer to the PCB 30A. The projection 11f extends annularly over the circumference of the opening 11e. A tip end of the projection 11f is a flat surface positioned generally parallel to the inner surface 30b, that is, a flat surface extending generally orthogonally to the first direction. With such a configuration, it is possible to reduce a gap between the projection 11f and the PCB 30A (inner surface 30b); thus, it is possible to prevent the gas permeation in the adhesive 50 present in the narrowed zone and to more reliably bond the bottom wall 11a to the PCB 30A by the adhesive 50 present in a zone which deviates from the projection 11f and in which a gap between the bottom wall 11d3 and the inner surface 30b is wide.

[Sixth Modification of First Embodiment]

Figure 11:
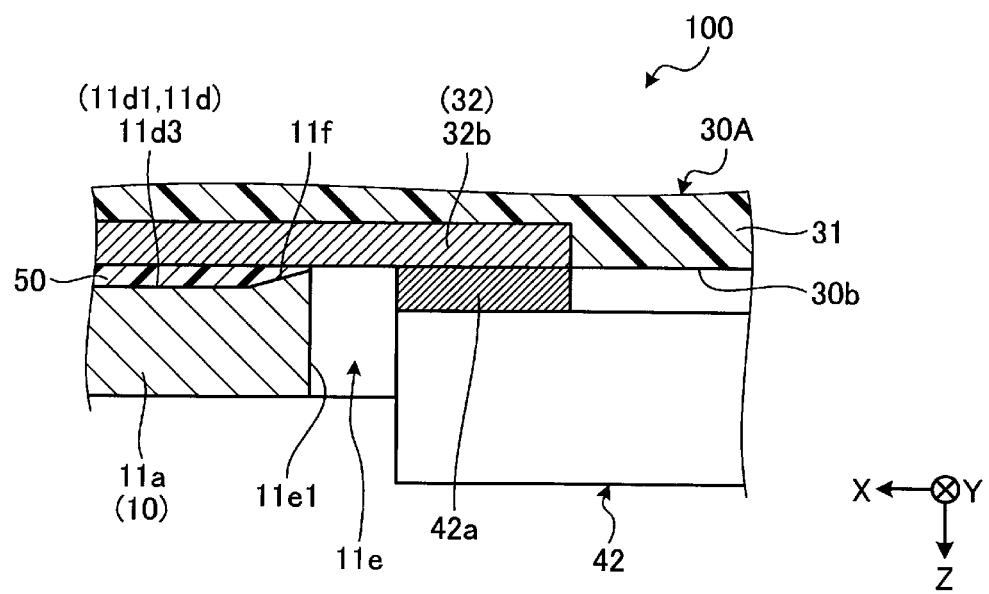
FIG. 11 is an exemplary, schematic cross-sectional view of an electronic apparatus according to a sixth modification of the first embodiment.

FIG. 11 is a cross-sectional view of part of the HDD 100 according to a sixth modification. In the present modification, similarly to the fifth modification, the bottom wall 11a includes, in the gap in which the adhesive 50 is present between the PCB 30A and the bottom wall 11a, the projection 11f that partially narrows the gap (reduces the height thereof). However, the present modification differs from the fifth modification in that a tip end of the projection 11f is not a flat surface generally parallel to the inner surface 30b but an inclined surface having a height larger as it becomes closer to the opening 11e. With such a configuration, similar actions and effects to those of the fifth modification can be attained.

[Second Embodiment]

Figure 12:
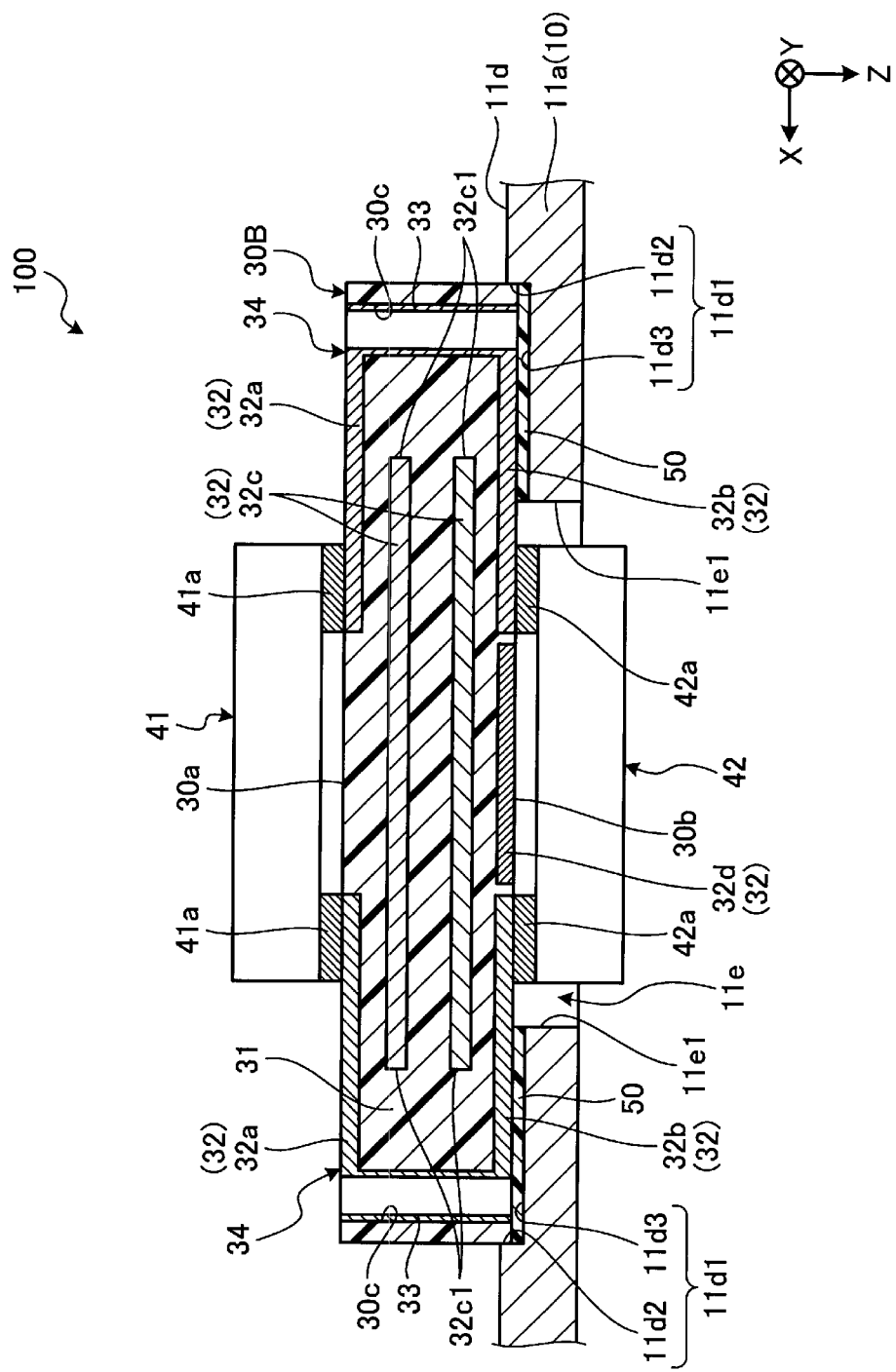
FIG. 12 is an exemplary, schematic cross-sectional view of an electronic apparatus according to a second embodiment.
Figure 13:
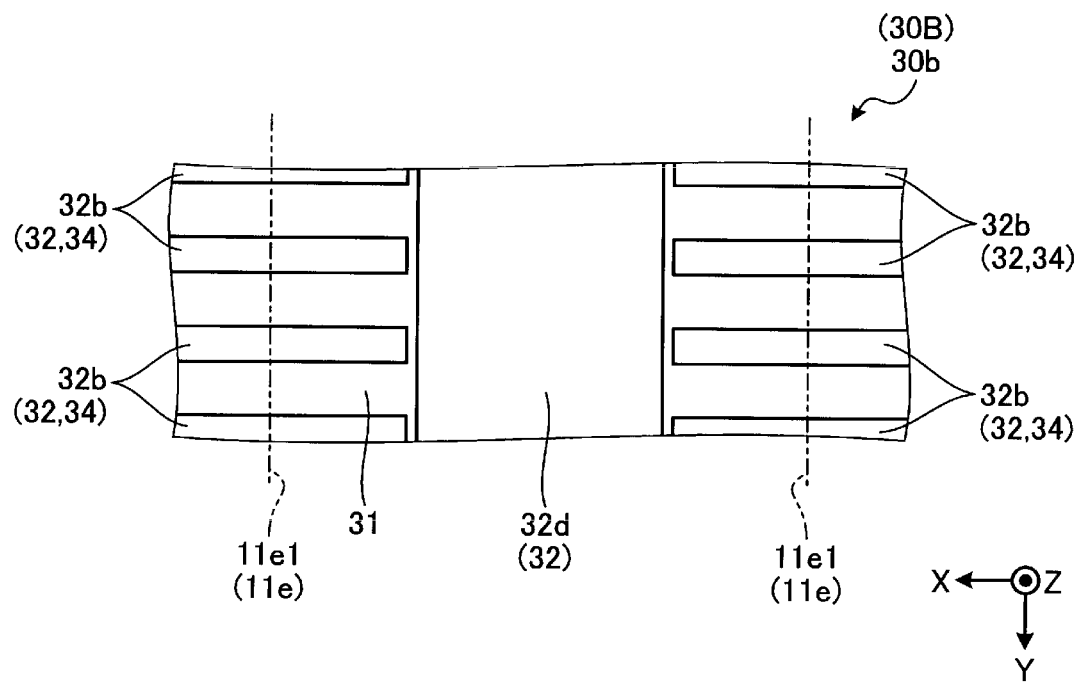
FIG. 13 is an exemplary, schematic plan view of part of a circuit board according to the second embodiment.

FIG. 12 is a cross-sectional view of part of the HDD 100 according to a second embodiment. FIG. 13 is a plan view of part of the inner surface 30b of a PCB 30B. The present embodiment differs from the preceding embodiment and the modifications in that the PCB 30B has a conductor layer 32d. As shown in FIG. 12, the conductor layer 32d is provided to be aligned to the conductor layers 32b on the inner surface 30b. The conductor layer 32d extends in the direction generally orthogonal to the first direction, that is, the direction generally parallel to the outer surface 30a and the inner surface 30b. The conductor layer 32d covers at least part of the opening 11e when viewed in the first direction. The conductor layer 32d is provided in a state of being insulated from the conductor layers 32b. Further, the conductor layer 32d may be electrically connected to the ground lines or the power supply lines. The conductor layer 32d is an example of a second shielding layer.

As shown in FIG. 13, the conductor layer 32d extends in the longitudinal direction of the casing 10 between the two rows of the conductor lines 34 (conductor layers 32b). The conductor layer 32d has a quadrangular shape such as a rectangular shape when viewed in the first direction (indicated by the arrow Z). Furthermore, the conductor layer 32 has a holeless shape without an opening such as a throughhole or a notch overlapping the opening 11e. With such a configuration, it is possible to reduce an area by which the base material layer 31 is exposed to the inside of the casing 10 on the inner surface 30b by providing, for example, the conductor layer 32d (second shielding layer); thus, it is possible to obtain the less gas permeable PCB 30B, compared with a configuration without the conductor layer 32d.

[First Modification of Second Embodiment]

Figure 14:
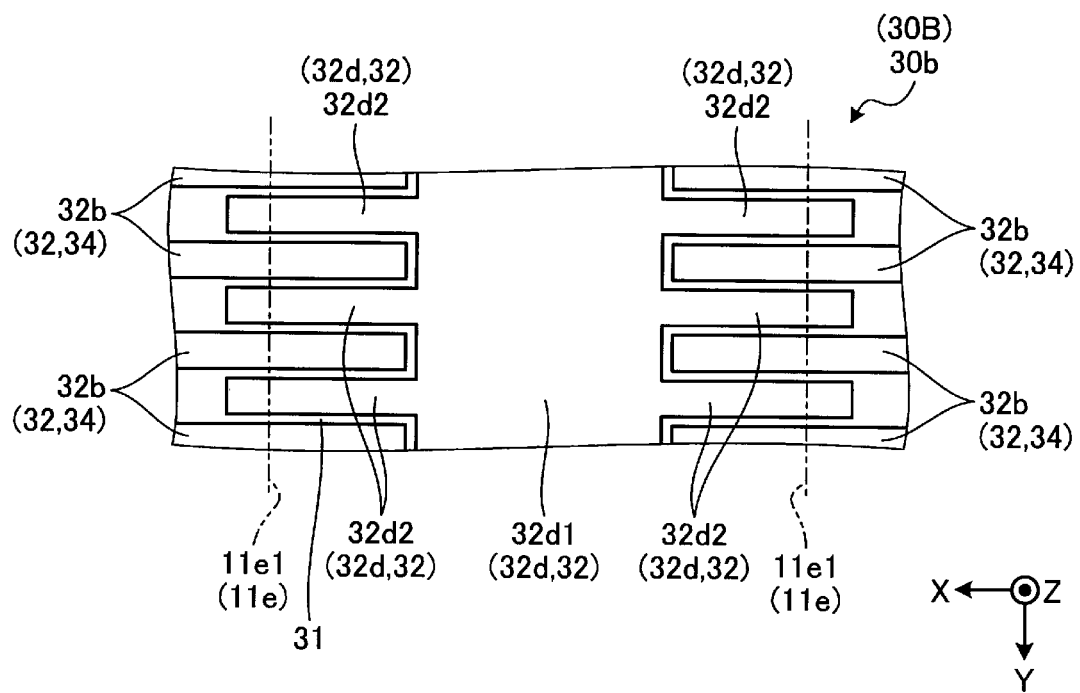
FIG. 14 is an exemplary, schematic plan view of an electronic apparatus according to a first modification of the second embodiment.

FIG. 14 is a plan view of part of the inner surface 30b of the PCB 30B according to a first modification. Similarly to the second embodiment, the present modification differs from the preceding embodiment and the modifications in that the PCB 30B has the conductor layer 32d. However, the present modification differs from the second embodiment in the shape of the conductor layer 32d. The conductor layer 32d has an intermediate portion 32d1 and arm portions 32d2. The intermediate portion 32d1 is located between the two rows of the conductor lines 34 (conductor layers 32b) and has a quadrangular shape when viewed in the first direction.

The arm portions 32d2 extend from the intermediate portion 32d1 in the longitudinal direction of the casing 10 between the two conductor layers 32b adjacent in the short-length direction of the casing. Tip ends of the arm portions 32d extend outward of the inner edge 11e1 of the opening 11e when viewed in the first direction. With such a configuration, it is possible to reduce the area by which the base material layer 31 is exposed to the inside of the casing 10 on the inner surface 30b by providing, for example, the conductor layer 32d (second shielding layer); thus, it is possible to obtain a less gas permeable PCB 30B.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Furthermore, the embodiments and the modifications can be carried out while configurations and shapes thereof are replaced partially by other configurations. Moreover, the embodiments and the modifications can be carried out while specifications such as each configuration and each shape (a structure, a type, a direction, a form, a magnitude, a length, a width, a thickness, a height, the number, a disposition, a position, a material, and the like) are changed as appropriate.

For example, the electronic apparatus is not limited to the HDD. Furthermore, specifications such as a shape and a magnitude of the electronic apparatus are not limited to those in the embodiments. The interior of the casing is not necessarily hermetically sealed and the air may be accommodated in the casing.

What is claimed is:

1. An electronic apparatus, comprising:
    a sealable casing having walls defining an interior portion thereof and an opening extending through a wall; and
    a circuit board located over the wall of the sealable casing and sealing the opening, the circuit board including:
        an insulating body having opposed first and second surfaces;
        a first conductor located over the first surface of the insulating body and extending partially over the opening in the sealable casing;
        a second conductor at least portion of which extends over the second surface and is exposed to the interior of the sealable casing at the opening, wherein a portion of the second conductor extends between the wall of the sealable casing and the second surface of the insulating body; and
        a third conductor extending through the insulating body of the circuit board and electrically connecting the first conductor and the second conductor, the third conductor being in contact with the second conductor at a location of the second conductor between the second surface of the insulating body and the wall of the sealable casing, wherein
    the sealable casing includes a recessed portion extending inwardly of the wall thereof around a perimeter of the opening,
    the circuit board extends into the recessed portion of the sealable casing, and
    an adhesive is provided between the portion of the second conductor and a surface of the recessed portion of the sealable casing, the adhesive contacting the portion of the second conductor and the surface of the recessed portion of the sealable casing.

2. The electronic apparatus according to claim 1, wherein the insulating body of the circuit board includes an opening penetrating therethrough, and the third conductor extends through the opening in the insulating body.

3. The electronic apparatus of claim 2, further comprising a first shielding layer located in the insulating body between the first and second surfaces thereof, the first shielding layer extending over the opening in the sealable casing, an end of the first shielding layer being located over the portion of the second conductor extending between the second surface of the insulating body and the wall of the sealable casing.

4. The electronic apparatus of claim 3, further comprising a second shielding layer located between the second conductor and the first shielding layer and overlying at least a portion of the opening in the sealable casing.

5. The electronic apparatus according to claim 4, further comprising a third shielding layer located on the second surface of the insulating body and facing the opening in the sealable casing, the third shielding layer spaced from the perimeter of the opening in the sealable casing.

6. The electronic apparatus according to claim 3, wherein the end of the first shielding layer is located between a perimeter of the opening in the sealable casing and the opening in the insulating body of the circuit board.

7. The electronic apparatus according to claim 2, wherein the adhesive is provided at least between the opening in the insulating body of the circuit board and the perimeter of the opening in the sealable casing in a direction along the second surface.

8. The electronic apparatus according to claim 2, wherein the adhesive is provided also between the opening in the insulating body of the circuit board and the surface of the recessed portion.

* * * * *